United States Patent [19]

Andros et al.

[11] Patent Number: 5,012,235
[45] Date of Patent: Apr. 30, 1991

[54] PAGING RECEIVER WITH CONTINUOUSLY TUNABLE ANTENNA AND RF AMPLIFIER

[75] Inventors: Andrew A. Andros, Spring, Tex.; Thomas J. Campana, Jr., Chicago, Ill.

[73] Assignee: Telefind Corporation, Coral Gables, Fla.

[21] Appl. No.: 329,543

[22] Filed: Mar. 28, 1989

Related U.S. Application Data

[63] Continuation-in-part of Ser. No. 110,514, Oct. 20, 1987, Pat. No. 4,851,830.

[51] Int. Cl.⁵ .............................................. H04Q 1/00
[52] U.S. Cl. ................................ 340/825.44; 455/54; 455/182; 455/192
[58] Field of Search ................. 455/193, 186, 54, 164, 455/173, 188, 176, 192, 195, 269, 341, 182, 184, 191; 343/145, 718, 720; 330/84, 124 R, 126; 340/825.44

[56] References Cited

U.S. PATENT DOCUMENTS

| | | | |
|---|---|---|---|
| 3,703,685 | 11/1972 | Simopoulos et al. | 455/341 |
| 4,155,040 | 5/1979 | Harmon et al. | |
| 4,223,406 | 9/1980 | Someno | 455/182 |
| 4,291,414 | 9/1981 | Kimura | 455/184 |
| 4,418,428 | 11/1983 | Evans | 455/191 |
| 4,426,732 | 1/1984 | Mori | 455/341 |
| 4,686,708 | 8/1987 | Oki et al. | 455/193 |
| 4,817,196 | 3/1989 | Macnak et al. | 455/193 |
| 4,839,641 | 6/1989 | Mori et al. | 340/825.48 |
| 4,862,516 | 8/1989 | Macnak et al. | 343/718 |

FOREIGN PATENT DOCUMENTS 0161545 11/1985 European Pat. Off. ....... 340/825.44

Primary Examiner—Donald J. Yusko
Assistant Examiner—Edwin C. Holloway, III
Attorney, Agent, or Firm—Antonelli, Terry, Stout & Kraus

[57] ABSTRACT

A RF paging receiver which is tunable to channels to receive pages comprising characters to be displayed with the pages being transmitted in a plurality of licensed frequency bands with each band containing a plurality of FM channels in which signal strength of pages on received channels in the bands varies as a result of variable antenna gain with programming of channels being accomplished by channel programming commands in accordance with the invention includes a tunable antenna (12, 14) having a reception bandwidth spanning the frequency bands with the antenna being tunable in response to an antenna tuning signal to achieve maximum antenna gain for a received channel in any one of the plurality of licensed frequency bands; a RF tuner (16), coupled to the tunable antenna, for receiving individual channels from the bands in response to varying a receiver tuning signal specifying reception of one of the channels within the plurality of frequency bands, the RF tuner comprising a plurality of RF amplifiers (102, 104 and 106) with each RF amplifier for amplifying channels from at least one different licensed frequency band, each RF amplifier having an operating bandwidth which is narrower in frequency than the frequency band of channels applied to the RF amplifier and which is shiftable to center the operating bandwidth within the frequency band of channels amplified by the RF amplifier on the specified channel; an IF signal processor (34), coupled to the RF tuner, for producing an intermediate frequency signal, for producing the antenna tuning signal which is a function of the level of the intermediate signal during operation of the RF tuner to dynamically tune the antenna to achieve maximum antenna gain in response to variation in the gain of the antenna in receiving a channel from any one of the channels within the frequency bands and for providing the RF amplifier tuning signal which is a function of the level of the intermediate frequency signal and the receiver tuning signal; a display (64') for displaying characters contained within a page; and a controller (24), coupled to the intermediate frequency signal, and responsive to channel programming commands, for decoding a change in at least one channel contained within a channel programming command and controlling generation of the receiver tuning signal applied to the RF tuner specifying reception of one channel specified by a received channel programming command from one of the frequency bands to cause reception of the specified channel and display of characters in pages received on the channel on the display.

33 Claims, 7 Drawing Sheets

PAGING RECEIVER WITH CONTINUOUSLY TUNABLE ANTENNA AND RF AMPLIFIER

CROSS REFERENCE TO RELATED APPLICATION

This application is a Continuation-in-Part of application Ser. No. 110,514, filed on Oct. 20, 1987, entitled "Paging Receiver With Continuously Tunable Antenna", now U.S. Pat. No. 4,851,830 the subject matter of which is incorporated herein by reference in its entirety.

TECHNICAL FIELD

The present invention relates to RF paging receivers for receiving pages from channels within at least one licensed radio common carrier frequency band. More particularly, the present invention relates to paging receivers of the foregoing type having dynamically programmable channels of reception from at least one frequency band.

BACKGROUND ART

U.S. patent application Ser. No. 110,514, now U.S. Pat. No. 4,851,830 discloses a paging receiver with a continuously tunable antenna having programmable channels for receiving pages from 10,600 channels contained in the VHF and UHF bands (149–162, 278–290 and 449–462 MHz) used for in approximately 98% of the licensed paging channels in use today in the world. The tuned antenna disclosed in the aforementioned patent application is required to have a wide bandwidth to permit the reception of channels within the aforementioned plural frequency bands. The channels which are received by the paging receiver disclosed in the aforementioned application are dynamically programmable by a channel programming command which permits the channel(s) being received to be changed to accommodate varying paging traffic on channels used by a local paging service as well as to accommodate transporting of the paging receiver to remote areas out of broadcast range of the transmitter of the local paging service providing paging service to receive pages on another channel(s) which are relayed to the remote area by a long distance paging network. Existing long distance commercial paging networks to date rely upon paging receivers being programmed to receive a single channel or to sequentially scan a group of closely spaced channels in a single frequency band.

FIG. 1 illustrates a block diagram of paging receiver 10 as disclosed in Ser. No. 110,514. Actual circuits for implementing the various functions of the block diagram of FIG. 1 are set forth in FIGS. 7-20 of Ser. No. 110,514. Additionally, the main control program for the main CPU 24 is set forth in the Appendix contained within Ser. No. 110,514.

An internal antenna 12 functions to receive a total of 10,600 possible programmable channels from the three discrete frequency bands referred to above. The channels are programmed by a channel programming command disclosed in Ser. No. 110,514. Because of the large number of possible channels which may be received in the distinct three frequency bands, the antenna 12 has a broad band reception characteristic. In the paging receiver, the antenna 12 is designed to the extent possible to be resonant in all of the three frequency bands from which it is designed to receive channels. In other words, an optimum impedance match is desired.

The gain of the antenna 12 is subject to substantial variation as a consequence of interaction of the antenna with the person on which the paging receiver is typically located and as a consequence of interaction of the antenna with the physical surroundings of the paging receiver. The person's body on which a paging receiver is located, physical surroundings and electrical interference caused by the main CPU 24 and VCO 30 described below can substantially degrade the gain of the received page applied by the antenna 12 to antenna circuit 14. The antenna circuit 14 is a tuner containing variable capacitance diodes to which is applied an ANTENNA TUNING SIGNAL to maximize the gain of the antenna 12 for the particular channel that RF tuner 16 is tuned to receive. The antenna circuit 14 is tuned by the ANTENNA TUNING SIGNAL which functions to tune the antenna 12 to achieve maximum gain in a manner described below in detail. The RF tuner 16 is comprised of three separate radio frequency amplifiers and mixers 18, 20 and 22 which respectively receive UHF 149–162 and 278–190 MHz channels and 449–462 MHz VHF channels. The main CPU 24 controls the activation of a power controller 26 which selectively activates one of the amplifier and mixer circuits 18, 20 and 22 depending upon in which of the frequency bands a page is being received. The digital RECEIVER TUNING SIGNAL outputted by the main CPU 24 specifies one of the 10,600 possible channels to be received which are stored in ROM 58 as discussed below. The RECEIVER TUNING SIGNAL is applied to phase lock loop 28 which frequency locks the voltage controlled oscillator 30 on the particular channel specified by the RECEIVER TUNING SIGNAL. When a particular channel is to be received by the RF tuner 16, the main CPU 24 digitally commands the power controller 26 to activate a particular one of the amplifier and mixer circuits 18, 20 and 22 which is to receive the channel to be received. By deactivating the remaining two amplifier mixer circuits power is conserved over that which would be consumed if all three amplifiers and mixer circuits 18, 20 and 22 were simultaneously activated which is important in a battery operated paging receiver. The voltage controlled oscillator 30 produces an output frequency which is mixed with the signal being received by one of the amplifier and mixers 18, 20 and 22 to produce a 21.4 MHz output signal. The 21.4 MHz output signal is filtered by a 21.4 MHz filter 32. The output of the 21.4 MHz filter 32 is applied to an IF processing signal circuit 34 to produce the IF signal of 450 kHz. The output signal from the mixer oscillator 36 is applied to an IF amplifier 38 which amplifies the IF signal to a level sufficient for discrimination by FM discriminator circuit 40. A RSSI circuit (received signal strength indicator) 42 produces an output signal having a magnitude directly proportional to the level of the output signal from the discriminator 40. The RSSI signal outputted by the RSSI circuit 42 is applied to an antenna controller circuit 44. The antenna controller circuit 44 contains an analog-to-digital converter 46 which converts the analog RSSI signal into digital format suitable for processing by a dedicated ASIC microprocessor. The ASIC microprocessor executes a program contained in a ROM in the ASIC circuit. The ASIC microprocessor functions to produce a wobble signal which is outputted as a variable digital value which is applied to digital-to-analog converter 48 to produce the ANTENNA TUNING SIGNAL having a variable analog value which causes the antenna circuit 14 to be tuned variably through a frequency band for the purpose of continually locking on the point of maximum gain as a channel is being received. The variation in signal amplitude caused by the wobbling of the tuned frequency of the antenna circuit 14 is detected by the RSSI circuit 42 so that the antenna controller circuit 44 continually outputs an ANTENNA TUNING SIGNAL which tunes the antenna circuit to achieve maximum gain for the antenna 12. The ANTENNA TUNING SIGNAL compensates for environmental factors which change the gain of the antenna 12 during reception such as variable inductance and capacitance caused by a person's body and the physical surroundings as well as compensating for electrical interference caused by the CPU 24 and VCO 30. The discriminator circuit 40 outputs either no signal (level F) or one of fifteen discrete sinusoidal frequencies each of which encodes a different signal value received from either an analog or digital FM paging receiver transmitter. A buffer amplifier 50 amplifies the sinusoidal output signal from the discriminator circuit 40 to a level to create a square wave having a period equal to the period of the sinusoidal signal outputted by the discriminator 40. The square wave outputted by the buffer amplifier 50 is filtered by low pass filter 52 to attenuate frequencies below 400 hertz. The output of the low pass filter 52 is applied to high pass filter 54 which attenuates channels above 3000 hertz. A tone decoder circuit 56 converts the discrete tones contained within the 400 to 3000 hertz pass band defined by the low pass filter 52 and high pass filter 54 to produce an output level signal indicative of 16 possible levels. The main CPU 24 processes successive coded transmissions of data by combining them into a two-digit decimal number and decoding the two-digit number into alphanumeric characters. Single coded transmissions are used for numeric only characters. The control program for the main CPU 24, is stored in ROM 58. The ROM 58 also stores the possible channels which may be received, which in the preferred embodiment are 10,600, a command structure table used for decoding each of the commands as disclosed in Ser. No. 110,514, as well as the display control for the LCD display 64'. Variable data is stored in RAM 60. The RAM 60 has separate memory sections for storing pages including specific memory sections which are addressable by command, the channels which are programmed to be received by the channel programming command including any destination code for restricting reception of pages or a group of paging receivers to receive a page in a geographical area and the paging receiver identification. The main CPU 24 controls a liquid crystal display driver circuit 62'. The liquid crystal driver circuit 62' drives a liquid crystal display 64'. An external data port 67 is used to relay the output signal from the discriminator 52 to another data processing or storage device when the main CPU 24 executes an external data command. A port 68 is coupled to the main CPU 24 for driving an external printer. A port 69 is provided for establishing necessary communications between the CPU 24 and an external printer. A display switch 70 is used for activating the display 64'. A light switch 71 is used for activating back lighting of the display 64'. The switches 70 and 71 may also be used for inputting data when suitable displays are made on the display 64' by the control program of the main CPU 24. Port 72 is connected to the paging receiver battery (not illustrated) for providing power. Port 73 is provided for activating an audio alarm contained in the paging receiver and port 74 permits connection to an external antenna which may be used when the paging receiver is connected to an external device such as a printer.

The main CPU 24 is responsive to a channel programming command to dynamically tune the RF tuner 16 to discrete channels. Each channel programming command is decoded by the main CPU 24 to output any change in channel contained therein of the 10,600 possible channels stored in ROM 58 for storage in a channel memory section of the random access memory 60.

The continuously tunable antenna of the paging receiver discussed above provides dynamic compensation for variable antenna gain consequent from receiving programmable channels within at least one frequency band. Dynamic compensation for variable antenna gain is especially important in achieving maximum reception range and accurate reception on programmable channels spanning at least one frequency band when the antenna is internal within the case of the paging receiver. As a consequence of an internal antenna having a short length, a person's body carrying the paging receiver and surroundings proximate to the person will often substantially vary the antenna gain. The dynamically tuned antenna of the paging receiver described above satisfactorily compensates for variation in antenna gain in a paging receiver having an internal antenna for receiving pages on channels which are dynamically programmed from multiple frequency bands.

The paging receiver discussed above is subject to degradation in reception performance in metropolitan areas. This degradation is caused by the RF amplifiers 18, 20 and 22 having a broadband reception characteristic spanning the entire bandwidth of each frequency band for amplifying pages received on channels contained within the band. For example, if the paging receiver is tuned to receive a channel on one end of a frequency band by applying an appropriate output signal from VCO 30 to the mixer within the amplifier, the broadband amplification characteristic of the amplifier will amplify received signals contained in other parts of the band which diminishes the overall signal to noise ratio of the signal being inputted into the mixer on the channel being received which contains the page. This diminishing of the signal to noise ratio can severely degrade the ability of the paging receiver to accurately receive alpha-numeric and numeric pages in areas such as large metropolitan areas where large numbers of other signals are simultaneously present from non paging sources or from other paging channels within a frequency band containing a channel on which the paging receiver is receiving pages.

DISCLOSURE OF THE INVENTION

The present invention is an improved paging receiver which utilizes a tunable antenna and tuned RF amplifier to achieve maximum gain on channels being received from at least one of the plurality of licensed radio frequency bands which are received by paging receivers throughout the world today. The paging receiver preferably is tunable by a channel programming command to program reception of at least one channel which may be chosen from a plurality of frequency bands which are used for paging receivers. The tunable antenna is tuned to maximize antenna gain for each channel being received and works in the manner described above with reference to Ser. No. 110,514. In accordance with the invention, each RF amplifier for amplifying a page received on any channel from a frequency band has an operating bandwidth which is narrower in frequency than the frequency band and is tunable to shift the center of the operating bandwidth within the frequency band on the specified channel to maximize amplifier gain.

Tests have shown that the addition of the tunable RF amplifier for receiving channels from licensed radio common frequency bands used for paging receivers increases the gain of the signal outputted from the RF amplifier by up to 10 dB. The narrowing of the operating bandwidth of the RF amplifier by the present invention from an operating bandwidth spinning the entire frequency band as in the receiver of FIG. 1 to an operating bandwidth of approximately 675 kHz at the 65 dB down point increases the reliability of receiving pages in areas where many other signals exist in the frequency band on which the channel is being received. The combination of the tunable antenna and tunable RF amplifier(s) permits a paging receiver in accordance with the present invention to reliably receive pages out to line of site distances which is the practical limit of pages transmitted on FM radio common carriers within the bands licensed for paging throughout the world today if signal reflections are not present.

A RF paging receiver which is tunable to channels to receive pages being transmitted in at least one licensed frequency band with each frequency band containing a plurality of FM channels in which signal strength of the pages on received channels in the at least one frequency band varies as a result of variable antenna gain in accordance with the invention includes a tunable antenna having a reception bandwidth spanning the at least one frequency band with the antenna being tunable in response to an antenna tuning signal to achieve maximum antenna gain for a received channel in the at least one licensed frequency band; a RF tuner, coupled to the tunable antenna, which is tunable for receiving each of the channels from the at least one frequency band in response to varying a receiver tuning signal specifying reception of any one of the channels within the at least one frequency band, the RF tuner comprising at least one RF amplifier with each RF amplifier for amplifying a page received on any channel within at least one frequency band, each RF amplifier having an operating bandwidth which is narrower in frequency than the at least one frequency band of channels applied to the RF amplifier and which is shiftable to center the operating bandwidth within the at least one licensed frequency band of channels applied to the RF amplifier on the specified channel in response to an RF amplifier tuning signal; an IF signal processor, coupled to the RF tuner and to the receiver tuning signal, for producing an intermediate frequency signal, for producing the antenna tuning signal which is a function of the intermediate frequency signal during operation of the RF tuner to dynamically tune the antenna to achieve maximum antenna gain in response to variation in the gain of the antenna in receiving a channel from one of the channels within the at least one frequency band, and for producing the RF amplifier tuning signal which is a function of the intermediate frequency and the receiver tuning signal; and a controller, coupled to the intermediate frequency signal for controlling generation of the receiver tuning signal to cause the RF tuner to receive a specified channel from the at least one frequency band.

The page may comprise characters to be displayed and the paging receiver may include a display for displaying the characters within a received page. The amplifier tuning signal is proportional to a sum of the intermediate frequency signal and the receiver tuning signal with the receiver tuning signal varying from a minimum for a channel having a lowest frequency within the at least one frequency band to a maximum for a channel having a highest frequency within the at least one frequency band. The antenna is contained inside of the paging receiver; the paging receiver is battery powered; the RF tuner comprises a plurality of RF amplifiers with each RF amplifier for amplifying channels received from at least one different frequency band; and the controller controls activation of the plurality of RF amplifiers to cause only the RF amplifier, which amplifies channels of the frequency band within which the specified channel is contained, to be activated. Each RF amplifier applies an output signal to a mixer to which is applied a RF signal, equal in frequency to the specified channel, from a voltage controlled oscillator having a frequency of oscillation controlled by the controller. The paging receiver further includes a phase lock loop receiving the receiver tuning signal from the controller and is coupled to the voltage control oscillator for controlling the frequency of oscillation of the voltage control oscillator in accordance with a frequency specified by the receiver tuning signal.

An RF paging receiver which is tunable to channels to receive pages with the pages being transmitted in a plurality of licensed frequency bands with each band containing a plurality of FM channels in which the signal strength of pages on received channels in the bands varies as a result of variable antenna gain with programming of channels being accomplished by channel programming commands in accordance with the invention includes a tunable antenna having a reception bandwidth spanning the frequency bands with the antenna being tunable in response to an antenna tuning signal to achieve maximum antenna gain for a received channel in any one of the plurality of licensed frequency bands; a RF tuner, coupled to the tunable antenna, for receiving individual channels from the bands in response to varying a receiver tuning receiver specifying reception of one of the channels within the plurality of frequency bands, the RF tuner comprising a plurality of RF amplifiers with each RF amplifier for amplifying channels from at least one different licensed frequency band, each RF amplifier having an operating bandwidth which is narrower in frequency than the frequency band of channels applied to the RF amplifier and which is shiftable to center the operating bandwidth within the frequency band of channels applied by the RF amplifier on the specified channel in response to an RF amplifier tuning signal; an IF signal processor, coupled to the RF tuner, or producing an intermediate frequency signal, for producing the antenna tuning signal which is a function of the level of the intermediate frequency signal during operation of the RF tuner to dynamically tune the antenna to achieve maximum antenna gain in response to variation in the gain of the antenna in receiving a channel from any one of the channels within the frequency bands, and for producing the RF amplifier tuning signal which is a function of the level of the intermediate frequency signal and the receiver tuning signal; and a controller, coupled to the intermediate frequency signal, and responsive to channel programming commands, for decoding a change in at least one channel contained within a channel programming command and controlling generation of the receiver tuning signal applied to the RF tuner specifying reception of a channel specified by a received channel programming command from one of the frequency bands to cause reception of the specified channel. The page may comprise characters to be displayed and the paging receiver may include a display for displaying characters contained within a received page. The amplifier tuning signal is proportional to a sum of the intermediate frequency signal and the receiver tuning signal with the receiver tuning signal varying from a minimum for a channel having a lowest frequency within one of the plurality of frequency bands to a maximum for a channel having a highest frequency band within the one of the plurality of frequency bands. The antenna is contained inside of the paging receiver. The paging receiver is battery powered; and the controller controls activation of the plurality of RF amplifiers to cause only the RF amplifier, which amplifies channels of the frequency band within which the specified channel is contained, to be activated. Each RF amplifier applies an output signal to a mixer to which is applied an RF signal, equal in frequency to the specified channel, from a voltage controlled oscillator having a frequency of oscillation controlled by the controller. A phase lock loop receives the receiver tuning signal from the controller and is coupled to the voltage controlled oscillator for controlling the frequency of oscillation of the voltage controlled oscillator in accordance with a frequency specified by the receiver tuning signal.

A RF paging receiver which is tuned to channels to receive pages being transmitted in at least one licensed frequency band with each frequency band containing a plurality of FM channels in which signal strength of the pages on received channels in the at least one frequency band varies in accordance with the invention includes an antenna having a reception bandwidth spanning the at least one frequency band; a RF tuner, coupled to the antenna, for receiving the channels from the at least one frequency band in response to varying a receiver tuning signal specifying reception of any one of the channels within the at least one frequency band, the RF tuner comprising at least one RF amplifier with each RF amplifier for amplifying a page received on any channel within the at least one frequency band, each RF amplifier having an operating bandwidth which is narrower in frequency than the at least one frequency band of channels applied to the RF amplifier and which is shiftable to center the operating bandwidth within the at least one licensed frequency band of channels applied to the RF amplifier on the specified channel in response to an RF amplifier tuning signal; an IF signal processor, coupled to the RF tuner and to the receiver tuning signal, for producing an intermediate frequency signal and for producing the RF amplifier tuning signal which is a function of the intermediate frequency signal and the receiver tuning signal; and a controller coupled to the intermediate frequency signal for controlling generation of the receiver tuning signal to cause the RF tuner to receive a specified channel from the at least one frequency band. The pages may comprise characters to be displayed and the paging receiver may include a display for displaying characters within the received page; and the controller controls the display of received characters in pages on the channel on the display. The amplifier tuning signal is proportional to a sum of the intermediate frequency signal and the receiver tuning signal with the receiver tuning signal varying from a minimum for a channel having a lowest frequency within the at least one frequency band to a maximum for a channel having highest frequency within the at least one frequency band. The antenna is contained inside of the paging receiver. The paging receiver is battery powered; the RF tuner comprises a plurality of RF amplifiers with each RF amplifier for amplifying channels received from at least one different frequency band; and the controller controls activation of the plurality of RF amplifiers to cause only the RF amplifier, which amplifies channels of the frequency band within which the specified channel is contained, to be activated. The RF amplifier applies an output signal to a mixer to which is applied an RF signal, equal in frequency to the specified channel, from a voltage controlled oscillator having a frequency of oscillation controlled by the controller. A phase lock loop receives the receiver tuning signal from controller and is coupled to the voltage controlled oscillator for controlling the frequency of oscillation of the voltage controlled oscillator in accordance with a frequency specified by the receiver tuning signal.

A RF paging receiver which is tunable to channels to receive pages with pages being transmitted in a plurality of licensed frequency bands with each frequency band containing a plurality of FM channels in which signal strength of the pages on received channels in the frequency bands varies with programming of channels being accomplished by channel programming commands in accordance with the invention includes an antenna having a reception bandwidth spanning the plurality of frequency bands; an RF tuner, coupled to the antenna, for receiving individual channels from the bands in response to varying a receiver tuning signal specifying reception of one of the channels within the plurality of frequency bands, the RF tuner comprising a plurality of RF amplifiers with each RF amplifier for amplifying channels from at least one different licensed frequency band, each RF amplifier having an operating bandwidth which is narrower in frequency than the frequency band of channels applied to the RF amplifier and which is shiftable to center the operating bandwidth within the at least one frequency band of channels applied to the RF amplifier on the specified channel in response to an RF amplifier tuning signal; an IF signal processor, coupled to the RF tuner to the receiver tuning signal, for producing an intermediate frequency signal and for producing the RF amplifier tuning signal which is a function of the intermediate frequency signal and the receiver tuning signal; and a controller, coupled to the intermediate frequency signal and responsive to channel programming commands for decoding a change in at least one channel contained within a channel programming command, for controlling generation of the receiver tuning signal applied to the RF tuner specifying reception of a channel specified by a received channel programming command from one of the frequency bands to cause the RF tuner to receive a specified channel from the plurality of frequency bands. The page may comprise characters to be displayed; the paging receiver may include a display for displaying characters within a received page; and the controller may control the display of received characters in pages on a specified channel on the display. The amplifier tuning signal is proportional to a sum of the intermediate frequency signal and the receiver tuning signal with the receiver tuning signal varying from a minimum for a channel having a lowest frequency within the plurality of frequency bands to a maximum for a channel having a highest frequency within the at least one frequency band. The antenna is contained inside of the paging receiver. The paging receiver is battery powered; and the controller controls activation of the plurality of RF amplifiers to cause only the RF amplifier, which amplifies channels of the frequency band within which the specified channel is contained, to be activated. Each RF amplifier applies an output signal to a mixer to which is applied a RF signal, equal in frequency to the specified channel, from a voltage controlled oscillator having a frequency of oscillation controlled by the controller. A phase lock loop receives the receiver tuning signal from a controller and is coupled to the voltage controlled oscillator for controlling the frequency of oscillation of the voltage controlled oscillator in accordance with a frequency specified by the receiving tuning signal.

BEST MODE FOR CARRYING OUT THE INVENTION

Figure 1:
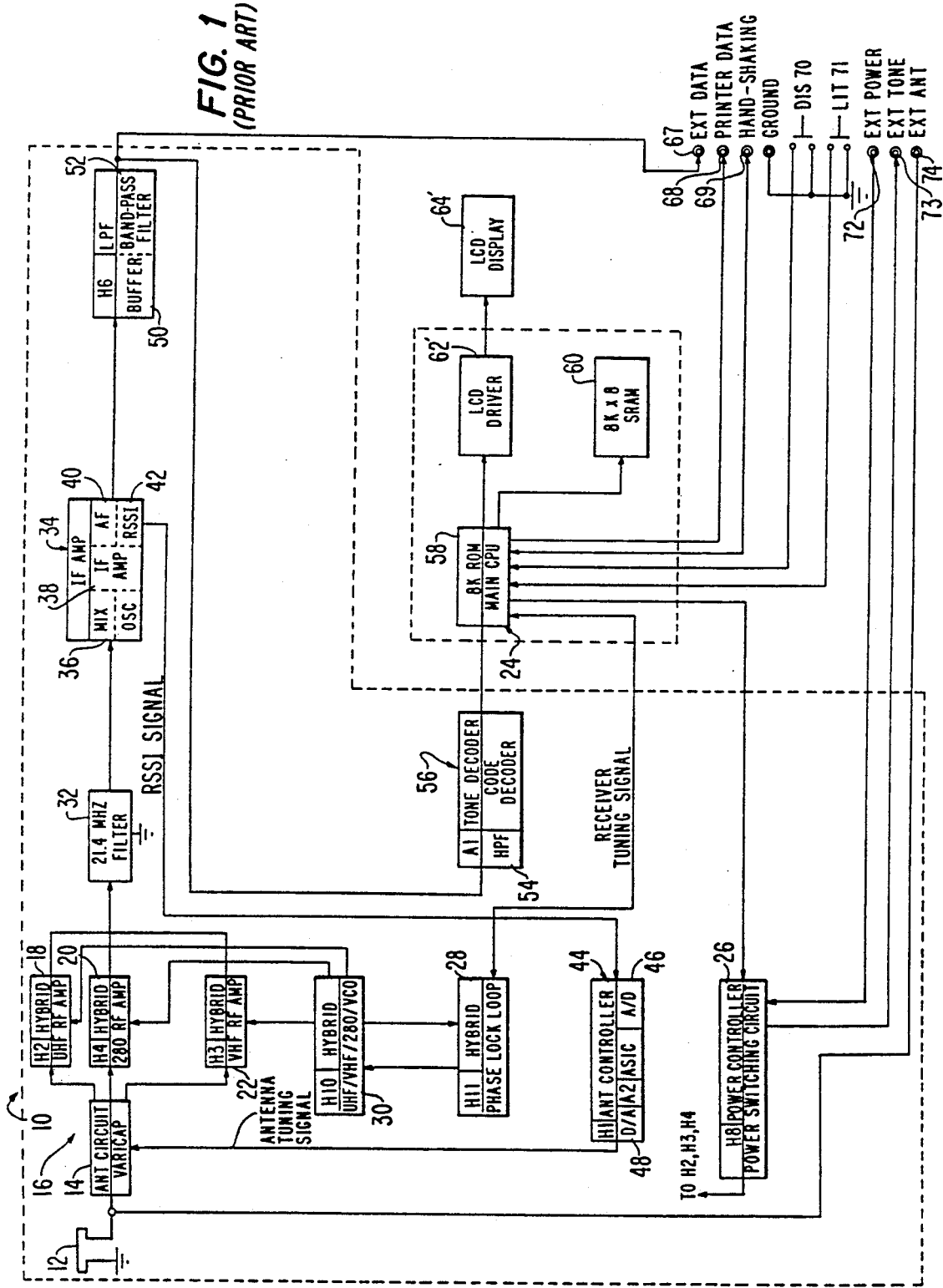
FIG. 1 illustrates a prior art paging receiver of the assignee of the present invention.
Figure 2:
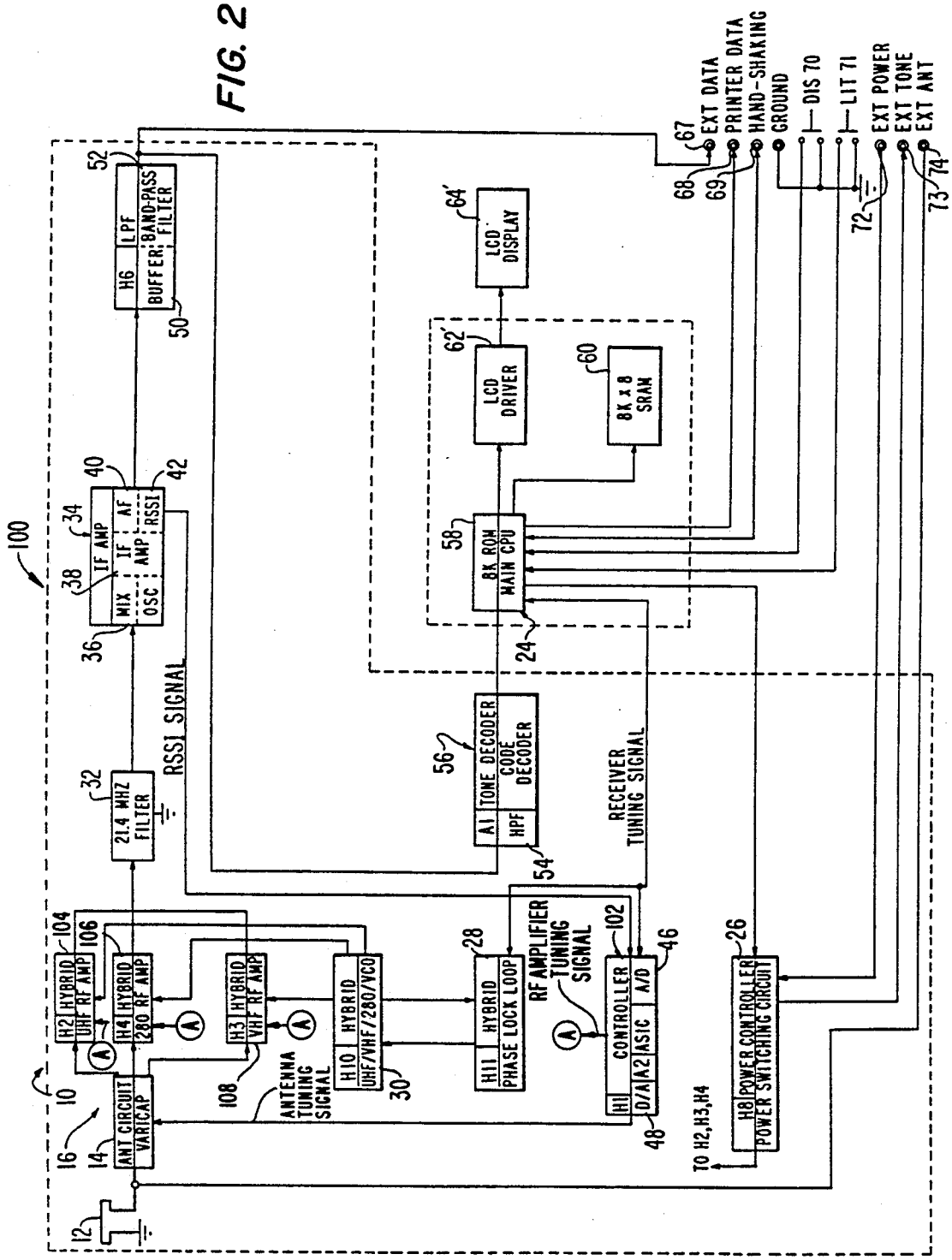
FIG. 2 illustrates a block diagram of a paging receiver in accordance with the present invention.

FIG. 2 illustrates a block diagram of a RF paging receiver 100 in accordance with the present invention. Like parts are identified by like reference numerals in FIGS. 1 and 2. Parts in FIG. 2 which are identical to those illustrated in FIG. 1 and which are not necessary for understanding the present invention are not discussed in conjunction with FIG. 2. The paging receiver 100 of FIG. 2 differs from the paging receiver of FIG. 1 in that the RF amplifier contained in each of the RF amplifier and mixers 104, 106 and 108 has a shiftable operating bandwidth which is centered by an RF AMPLIFIER TUNING SIGNAL on the channel being received. The RF AMPLIFIER TUNING SIGNAL is a function of the RECEIVER TUNING SIGNAL and the RSSI SIGNAL. The RF AMPLIFIER TUNING SIGNAL is produced by the controller 102. The controller 102 controls the antenna 12 in the same manner as described in conjunction with the prior art of FIG. 1 and further produces the RF AMPLIFIER TUNING SIGNAL as discussed below in conjunction with FIGS. 3 and 4. The RF AMPLIFIER TUNING SIGNAL shifts the center of the operating bandwidth of the RF amplifiers and mixers 104, 106 and 108 as a function of the gain of the antenna as indicated by the RSSI signal produced by the IF amplifier 34 as used in the prior art FIG. 1 to tune the antenna 12 and the channel being received as specified by the RECEIVER TUNING SIGNAL produced by the main CPU 24. As described below, the operating bandwidth of one of the RF amplifiers and mixers 104, 106 and 18, which is activated by the power controller 26 to receive the specified channel, is shifted to track the gain of the antenna and the RECEIVER TUNING SIGNAL so as to center the operating bandwidth of the RF amplifier to produce maximum gain of the amplified signals being applied to the mixer within the activated RF amplifier. The operating bandwidth of each of the RF amplifiers is tuned to a much narrower frequency range, which in a preferred embodiment is approximately 675 kilocycles in width at the 65 dB downpoint from the maximum amplitude at the center frequency of the operating bandwidth. Each amplifier 104, 106, and 108 is tunable to receive channels throughout the 13 megacycle bandwidth of each of the three licensed radio common carrier frequency bands on which pages are transmitted in the world today. As a consequence of the amplifiers within the RF amplifiers and mixers 104, 106 and 108 having a much higher Q than the 13 megacycle bandwidth of the licensed frequency bands from which channels are received, amplification of other signals which are within the frequency band being received but outside the operating bandwidth is eliminated which increases the signal-to-noise ratio of the output signal from the amplifier by up to 10 dB.

Figure 3:
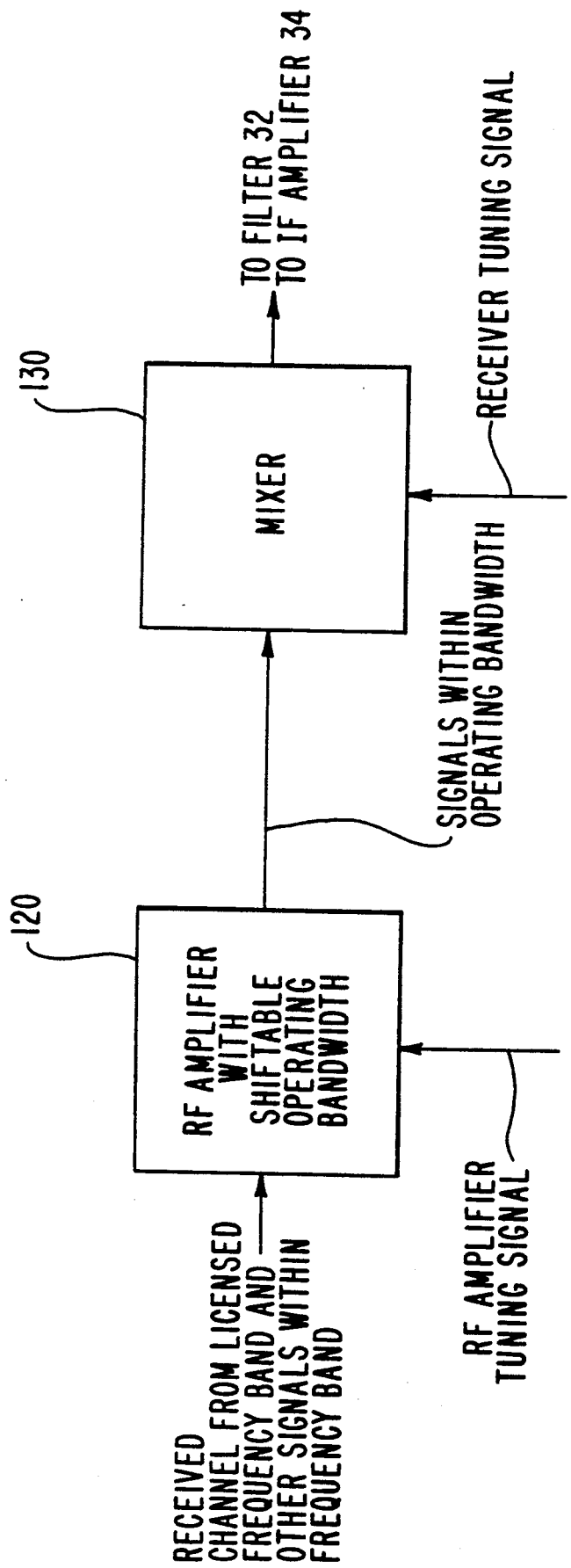
FIG. 3 is a block diagram of an RF amplifier in accordance with the invention.

FIG. 3 illustrates the block diagram of each of the RF amplifier and mixers 104, 106 and 108 in accordance with the present invention. A received channel from a licensed frequency band including other signals within the frequency band is applied to RF amplifier 120 which has a shiftable operating bandwidth as discussed below in conjunction with FIG. 5. The operating bandwidth of the RF amplifier 120 is shifted within the 13 MhZ bandwidth of the frequency band being amplified by the amplifier to center the operating bandwidth under control of the RF AMPLIFIER TUNING SIGNAL as discussed below with respect to FIG. 4. The output of the RF amplifier 120 contains signals within the operating bandwidth. As a consequence of the operating bandwidth being approximately 675 KhZ at 65 dB downpoint, the great majority of other signals within the frequency band containing the received channel are rejected by the RF amplifier which increases the signal-to-noise ratio substantially up to approximately 10 dB over that which was achieved by the prior art paging receiver of FIG. 1 in areas, such as large metropolitan areas, where many signals are present within the frequency band within which the received channel is contained but outside the operating bandwidth. Mixer 130 functions in the conventional manner to shift the frequency of the output signal from the RF amplifier 120 to the intermediate frequency as a consequence of the RECEIVER TUNING SIGNAL being applied thereto by the VCO 30. The output of the mixer is applied to the filter 32 and IF amplifier 34 as in the paging receiver of FIG. 1.

Figure 4:
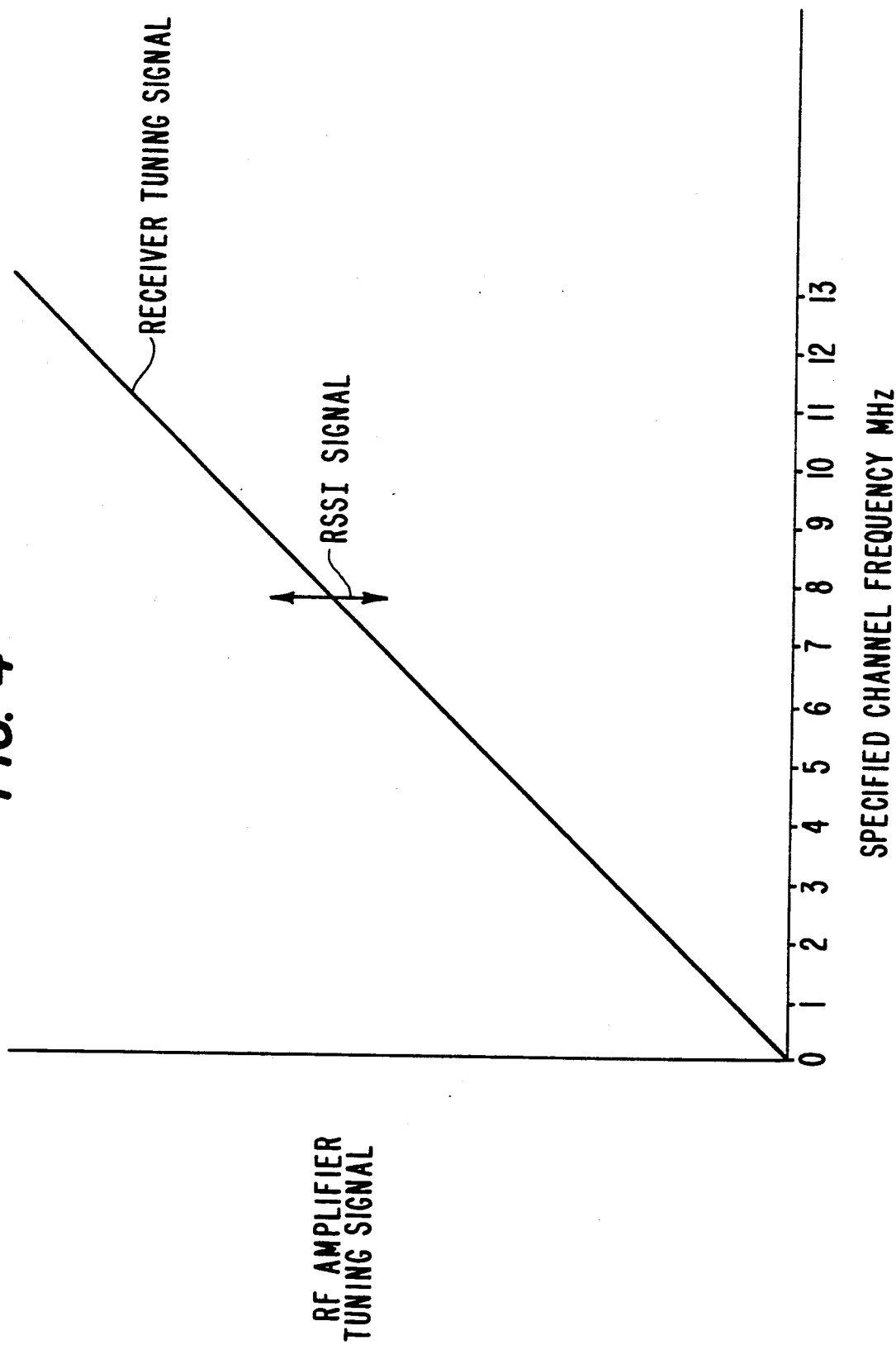
FIG. 4 illustrates the graphical relationship between the RF AMPLIFIER TUNING SIGNAL, RECEIVER TUNING SIGNAL, RSSI SIGNAL and specified channel frequency.

FIG. 4 graphically illustrates the relationship of the RF AMPLIFIER TUNING SIGNAL as a function of the RECEIVER TUNING SIGNAL and RSSI SIGNAL. In the preferred embodiment of the present invention, the RF AMPLIFIER TUNING SIGNAL is proportional to the sum of the RECEIVER TUNING SIGNAL and the RSSI SIGNAL. The RECEIVER TUNING SIGNAL is a linear function of the specified channel being received within a licensed frequency band with the RECEIVER TUNING SIGNAL being at a minimum (e.g. 3.5 volts) at the lowest channel within the frequency band and being at a maximum voltage at the highest channel within the frequency band and varying directly proportionally to the frequency of the channel being received in the licensed frequency band between the lowest and highest channels of the licensed frequency band. For example, reception of a channel midway between the lowest and highest channels would result in the generation of a RECEIVER TUNING SIGNAL having ½ the maximum level of the RECEIVER TUNING SIGNAL. The RSSI signal is directly proportional to the level of the output signal produced by the IF amplifier 34 and is also used in the generation of the antenna tuning signal applied to the antenna circuit 14 as in the paging receiver of FIG. 1. The RSSI signal varies linearly as a function of the antenna gain. The controller 102 produces the RF AMPLIFIER TUNING SIGNAL which is proportional to the sum of the RECEIVER TUNING SIGNAL and the RSSI SIGNAL with the magnitude of the RF AMPLIFIER TUNING SIGNAL varying with the variation of the RSSI SIGNAL and antenna gain with the RECEIVER TUNING SIGNAL component of the RF AMPLIFIER TUNING SIGNAL being constant for each channel being received. As a consequence of the RF AMPLIFIER TUNING SIGNAL being proportional to the fixed RECEIVER TUNING SIGNAL and the RSSI SIGNAL which is directly proportional to the variation in gain of the antenna, the RF AMPLIFIER TUNING SIGNAL provides a voltage for shifting the operating bandwidth of the RF amplifier to center the operating bandwidth on the specified channel being received to achieve maximum gain to provide a maximum signal to noise ratio which substantially enhances the ability of the paging receiver in accordance with the invention to accurately receive pages including discriminating characters within alphanumeric pages at long distances from the transmitter and in areas with many signals present in a frequency band in which a page is being received.

Figure 5:
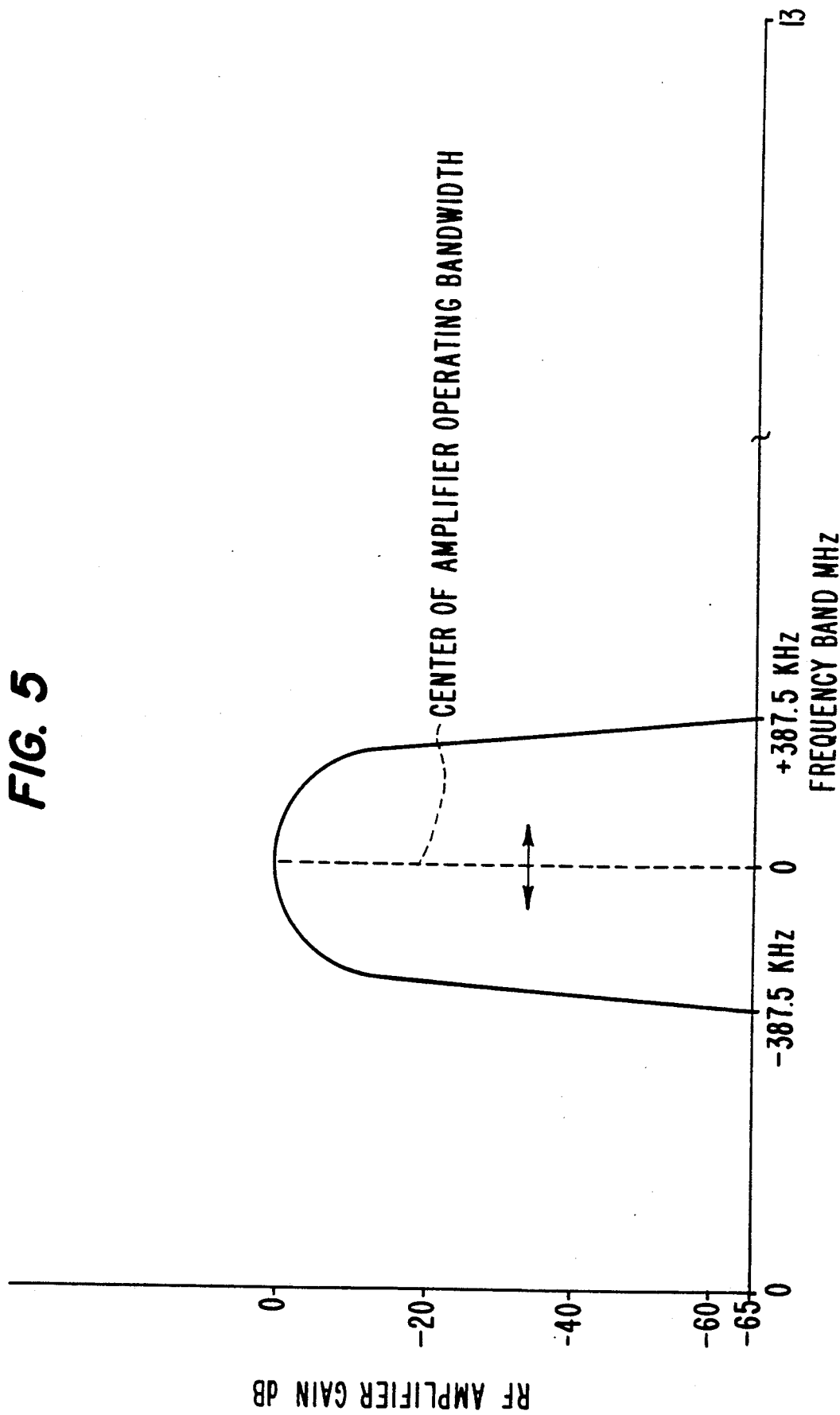
FIG. 5 illustrates the gain characteristic of each RF amplifier of the paging receiver of the present invention within a frequency band.
Figure 6:
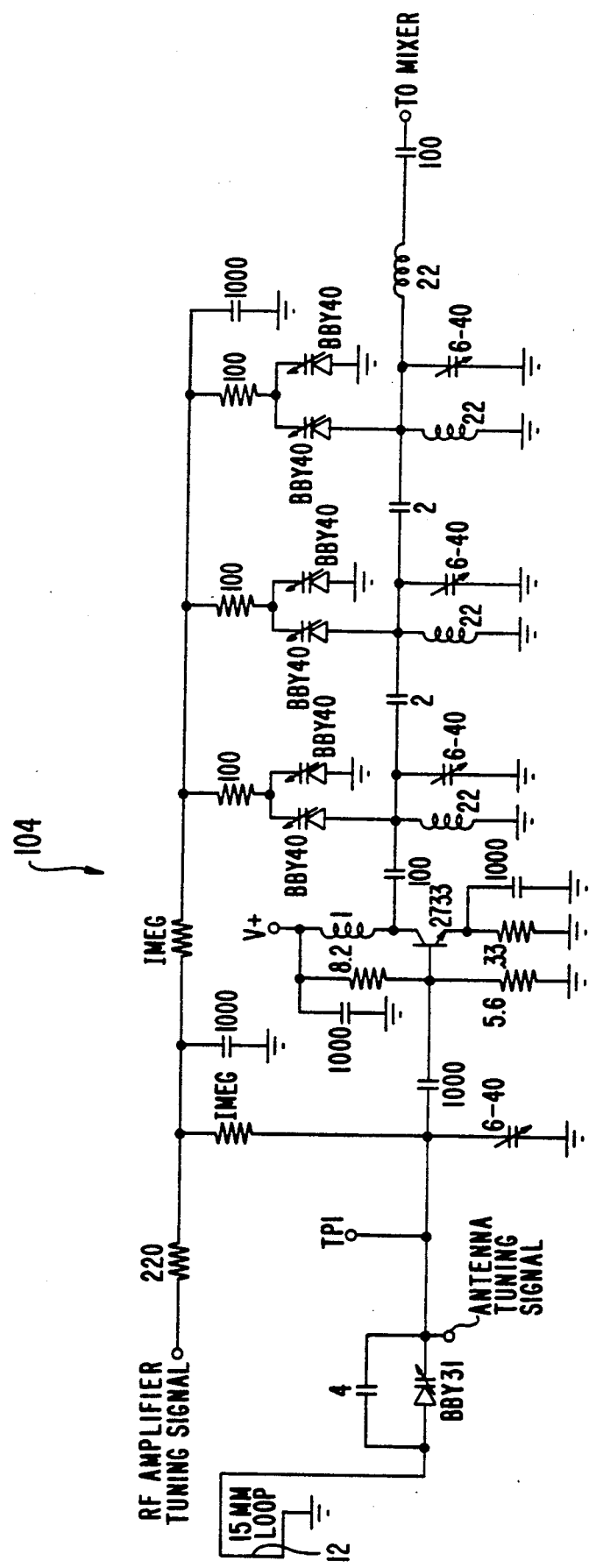
FIG. 6 illustrates a circuit schematic for implementing the RF amplifier 104 of the block diagram of FIG. 2.
Figure 7:
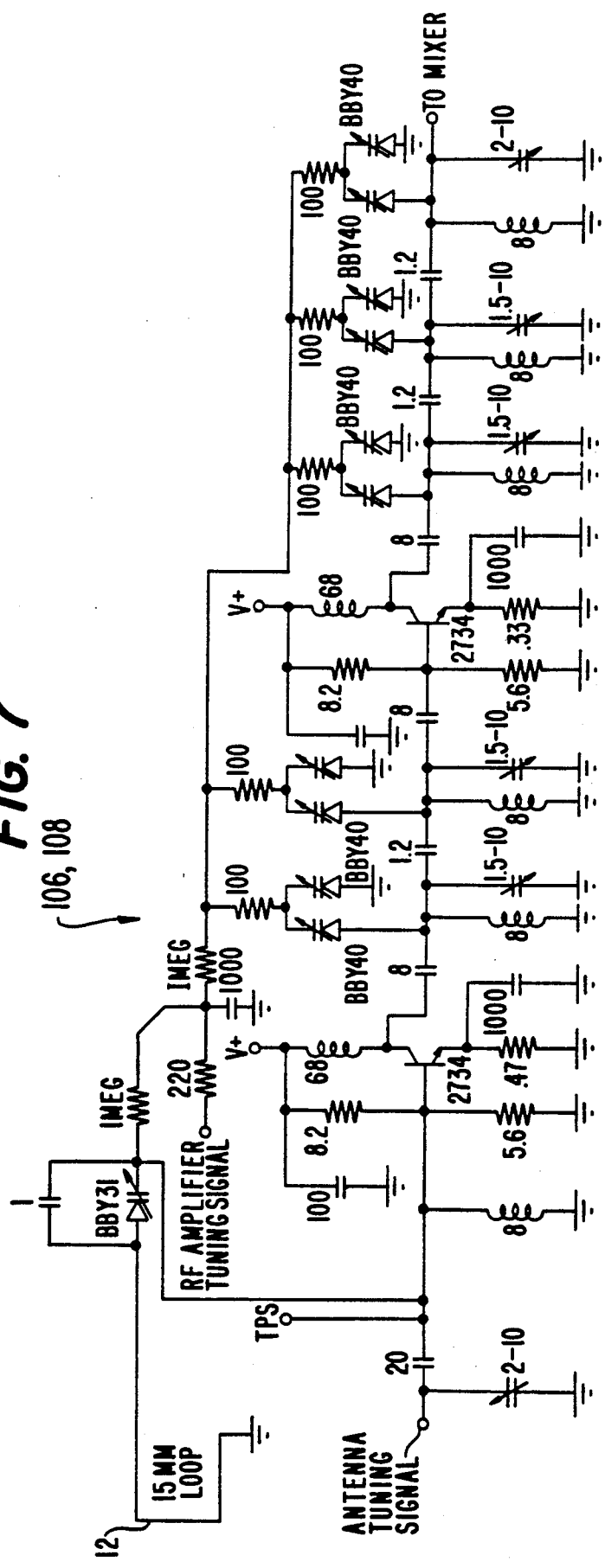
FIG. 7 illustrates a circuit schematic for implementing the RF amplifiers 106 and 108 of the block diagram of FIG. 2.

FIG. 5 illustrates the gain characteristic of each of the amplifiers of the RF amplifiers and mixers 104, 106 and 108 as a function of the overall bandwidth of each frequency band of channels which the amplifier amplifies. The center of amplifier operating bandwidth is shifted by varying the capacitance of varactor diodes contained in the amplifier as illustrated in FIGS. 6–7 discussed below under the control of the RF AMPLIFIER TUNING SIGNAL. The operating bandwidth has a 65 dB down point at ±387.5 KHZ from the center frequency.

FIGS. 6–7 illustrate a circuit schematic of a preferred embodiment of the RF amplifiers contained in the RF amplifiers and mixers 104–108 of FIG. 2. It should be understood that the choice of the components within the RF amplifiers including values may be varied in accordance with the invention from those illustrated. Part numbers are the manufacturer's or industry designation. Resistance values are in thousands of ohms, capacitance values are in picofarads and inductance values are in nano henries. The gain of the antenna tuning is varied by application of the ANTENNA TUNING SIGNAL to the variable capacitance diode BBY 31 to change its capacitance proportionally to the ANTENNA TUNING SIGNAL. The operating bandwidth of the RF amplifier is shifted by application of the AMPLIFIER TUNING SIGNAL to the variable capacitance diodes BBY 40 to change their capacitance proportionally to the RF AMPLIFIER TUNING SIGNAL.

While the invention has been described in terms of a preferred embodiment, it should be understood that numerous modifications may be made thereto without departing from the spirit and scope of the present invention. For example, it should be understood that while the preferred embodiment of the present invention pertains to pages containing alphanumeric characters, it should be understood that the present invention may be also utilized with pages which contain either vocal messages alone or in combination with alphanumeric characters or other alarms such as tone alarms. Furthermore, while a separate RF amplifier is used for each frequency band of channels being received in a preferred embodiment of the invention, it should be understood that one RF amplifier may be used for amplifying signals from more than one frequency band such as the 280 and 450 MHz bands. It is intended that all such modifications fall within the scope of the appended claims.

We claim:

1. A RF paging receiver which is tunable to channels to receive pages comprising characters to be displayed with the pages being transmitted in at least one licensed frequency band with each frequency band containing a plurality of FM channels in which signal strength of the pages on received channels in the at least one frequency band varies as a result of variable antenna gain comprising:
    (a) a tunable antenna having a reception bandwidth spanning the at least one frequency band with the antenna being tunable in response to an antenna tuning signal to achieve maximum antenna gain for a received channel in the at least one licensed frequency band;
    (b) a RF tuner, coupled to the tunable antenna, which is tunable for receiving individual channels from the at least one frequency band in response to varying a receiver tuning signal specifying reception of one of the channels within the at least one frequency band, the RF tuner comprising at least one RF amplifier with each RF amplifier for amplifying a page received on any channel within at least one frequency band, each RF amplifier having an operating bandwidth which is narrower in frequency than the at least one frequency band of channels applied to the RF amplifier and which is shiftable to center the operating bandwidth within the at least one frequency band of channels applied to the RF amplifier on the specified channel in response to an RF amplifier tuning signal;
    (c) an IF signal processing means, coupled to the RF tuner and to the receiver tuning signal, for producing an intermediate frequency signal, for providing the antenna tuning signal which is a function of the intermediate frequency signal during operation of the RF tuner to tune the antenna to achieve maximum antenna gain in response to receiving a specified channel from one of the channels within the at least one frequency band, and for producing the RF amplifier tuning signal by a summation of a signal which is a function of a magnitude of the intermediate frequency signal and a signal which is a function of a magnitude of the receiver tuning signal;

(d) a display for displaying the characters within the received page; and (e) a controller, coupled to the intermediate frequency signal, for controlling generation of the receiver tuning signal to cause the RF tuner to receive a specified channel from the at least one frequency band and display of received characters in pages on the channel on the display.

2. A RF paging receiving in accordance with claim 1 wherein:

the amplifier tuning signal is proportional to a sum of the intermediate frequency signal and the receiver tuning signal with the receiver tuning signal varying from a minimum for a channel having a lowest frequency within the at least one frequency band to a maximum for a channel having a highest frequency within the at least one frequency band.

3. A RF paging receiver in accordance with claim 1 wherein:

the antenna is contained inside the paging receiver.

4. A RF paging receiver in accordance with claim 3 wherein:

(a) the paging receiver is battery powered;

(b) the RF tuner comprises a plurality of RF amplifiers with each RF amplifier for amplifying channels received from at least one different frequency band; and the controller controls activation of the plurality of RF amplifiers to cause only the RF amplifier, which amplifies channels in the frequency band within which the specified channel is contained, to be activated.

5. A RF paging receiver in accordance with claim 4 wherein:

each RF amplifier applies an output signal to a mixer to which is applied a RF signal, equal in frequency to the specified channel, from a voltage controlled oscillator having a frequency of oscillation controlled by the controller.

6. A RF paging receiver in accordance with claim 5 further comprising:

a phase lock loop receiving the receiver tuning signal from the controller and coupled to the voltage controlled oscillator for controlling the frequency of oscillation of the voltage controlled oscillator in accordance with a frequency specified by the receiver tuning signal.

7. A RF paging receiver which is tunable to channels to receive pages comprising characters to be displayed with the pages being transmitted in a plurality of licensed frequency bands with each band containing a plurality of FM channels in which signal strength of pages on received channels in the bands varies as a result of variable antenna gain with programming of channels being accomplished by channel programming commands comprising:

(a) a tunable antenna having a reception bandwidth spanning the plurality of frequency bands with the antenna being tunable in response to an antenna tuning signal to achieve maximum antenna gain for a received channel in any one of the plurality of licensed frequency bands;

(b) a RF tuner, coupled to the tunable antenna, for receiving individual channels from the bands in response to varying a receiver tuning signal specifying reception of one of the channels with the plurality of frequency bands, the RF tuner comprising a plurality of RF amplifiers with each RF amplifier for amplifying channels from at least one frequency band, each RF amplifier having an operating bandwidth which is narrower in frequency than the frequency band of channels applied to the RF amplifier and which is shiftable to center the operating bandwidth within the at least one frequency band of channels applied to the RF amplifier on the specified channel in response to an RF amplifier tuning signal;

(c) an IF signal processing means, coupled to the RF tuner and to the receiver tuning signal, for producing an intermediate frequency signal for producing the antenna tuning signal which is a function of the intermediate signal during operation of the RF tuner to tune the antenna to achieve maximum antenna gain in response to receiving a specified channel from any one of the channels within the frequency bands, for producing the RF amplifier tuning signal by a summation of a signal which is a function of a level of the intermediate frequency signal and a signal which is a function of a level of the receiver tuning signal;

(d) a display for displaying characters contained within a received page; and (e) a controller, coupled to the intermediate frequency signal, and responsive to channel programming commands, for decoding a change in at least one channel contained within a channel programming command and controlling generation of the receiver turning signal applied to the RF tuner specifying reception of one channel specified by a received channel programming command from one of the frequency bands to cause reception of the specified channel and display of characters in pages received on the channel on the display.

8. A paging receiver in accordance with claim 7 wherein:

the amplifier tuning signal is proportional to a sum of the intermediate frequency signal and the receiver tuning signal with the receiver tuning signal varying from a minimum for a channel having a lowest frequency within the at least one frequency band to a maximum for a channel having a highest frequency within the at least one frequency band.

9. A RF paging receiver in accordance with claim 7 wherein:

(a) the paging receiver is battery powered; and (b) the controller controls the activation of the plurality of RF amplifiers to cause only the RF amplifier which amplifies channels of the frequency within which the specified channel is contained to be activated.

10. A RF paging receiver in accordance with claim 7 wherein:

the antenna is contained inside of the paging receiver.

11. A RF paging receiver in accordance with claim 10 wherein:

the frequency bands include UHF and VHF signal bands.

12. A RF paging receiver in accordance with claim 11 wherein:

VHF band includes a 280 MHz band with adjacent channels separated by a 2.5 KHz step, some adjacent channels in the VHF and UHF bands being separated by 5 KHz steps and some adjacent channels in the VHF band being separated by 6.25 KHZ steps.

13. A RF paging receiver which is tunable to channels to receive pages with the pages being transmitted in at least one licensed frequency band with each frequency band containing a plurality of FM channels in which signal strength of the pages on received channels in the at least one band varies as a result of variable antenna gain comprising:

(a) a tunable antenna having a reception bandwidth spanning the at least one frequency band with the antenna being tunable in response to an antenna tuning signal to achieve maximum antenna gain for a received channel in the at least one licensed frequency band;

(b) a RF tuner, coupled to the tunable antenna, which is tunable for receiving individual channels from the at least one frequency band in response to varying a receiver tuning signal specifying reception of one of the channels within the at least one frequency band, the RF tuner comprising at least one RF amplifier for amplifying pages received on any channel within the at least one frequency band and having an operating bandwidth which is narrower in frequency than the at least one frequency band and which is shiftable to center the operating bandwidth within the at least one licensed frequency band on the specified channel in response to an RF amplifier tuning signal;

(c) an IF amplifier, coupled to the RF tuner, for producing an intermediate frequency signal containing pages transmitted on the specified channel;

(d) means responsive to the intermediate frequency signal, for producing the antenna tuning signal as a function of the intermediate frequency signal; and (e) means, responsive to the intermediate frequency signal and the receiver tuning signal, for producing the RF amplifier tuning signal by a summation of a signal which is a function of a magnitude of the intermediate frequency signal and a signal which is a function of a magnitude of the receiver tuning signal.

14. A RF paging receiver in accordance with claim 13 wherein:

the amplifier tuning signal is proportional to a sum of the intermediate frequency signal and the receiver tuning signal with the receiver tuning signal varying from a minimum for a channel having a lowest frequency within the at least one frequency band to a maximum for a channel having a highest frequency within the at least one frequency band.

15. A RF paging receiver in accordance with claim 13 wherein:

(a) the RF tuner has a plurality of RF amplifiers, each RF amplifier amplifying pages received on channels from at least one different frequency band and having an operating bandwidth which is narrower in frequency than the frequency band and being shiftable to center the operating bandwidth within the frequency band of the RF amplifier in response to the RF amplifier tuning signal of the specified channel.

16. A RF paging receiver which is tunable to channels to receive pages being transmitted in at least one licensed frequency band with each frequency band containing a plurality of FM channels in which signal strength of the pages on received channels in the at least one frequency band varies as a result of variable antenna gain comprising:

(a) a tunable antenna having a reception bandwidth spanning the at least one frequency band with the antenna being tunable in response to an antenna tuning signal to achieve maximum antenna gain for a received channel in the at least one licensed frequency band;

(b) a RF tuner, coupled to the tunable antenna, which is tunable for receiving each of the individual channels from the at least one frequency band in response to varying a receiver tuning signal specifying reception of one of the channels within the at least one frequency band, the RF tuner comprising at least one RF amplifier with each RF amplifier for amplifying a page received on any channel within at least one frequency band, each RF amplifier having an operating bandwidth which is narrower in frequency than the at least one frequency band of channels applied to the RF amplifier and which is shiftable to center the operating bandwidth within the at least one licensed frequency band of channels applied to the RF amplifier on the specified channel in response to an RF amplifier tuning signal;

(c) an IF signal processing means, coupled to the RF tuner and to the receiver tuning signal, for producing an intermediate frequency signal, for producing the antenna tuning signal which is a function of the intermediate frequency signal during operation of the RF tuner to tune the antenna to achieve maximum antenna gain in response to receiving a specified channel from one of the channels within the at least one frequency band, and for producing the RF amplifier tuning signal by a summation of a signal which is a function of a magnitude of the intermediate frequency signal and a signal which is a function of a magnitude of the receiver tuning signal; and (d) a controller, couple to the intermediate frequency signal, for controlling generation of the receiver tuning signal to cause the RF tuner to receive a specified channel from the at least one frequency band.

17. A RF paging receiving in accordance with claim 16 wherein:

the amplifier tuning signal is proportional to a sum of the intermediate frequency signal and the receiver tuning signal with the receiver tuning signal varying from a minimum for a channel having a lowest frequency within the at least one frequency band to a maximum for a channel having a highest frequency within the at least one frequency band.

18. A RF paging receiver in accordance with claim 16 wherein:

the antenna is contained inside the paging receiver.

19. A RF paging receiver in accordance with claim 18 wherein:

(a) the paging receiver is battery powered;

(b) the RF tuner comprises a plurality of RF amplifiers with each RF amplifier for amplifying channels received from at least one different frequency band; and the controller controls activation of the plurality of RF amplifiers to cause only the RF amplifier, which amplifies channels in the frequency band within which the specified channel is contained to be activated.

20. A RF paging receiver in accordance with claim 19 wherein:

each RF amplifier applies an output signal to a mixer to which is applied a RF signal, equal in frequency to the specified channel, from a voltage controlled oscillator having a frequency of oscillation controlled by the controller.

21. A RF paging receiver in accordance with claim 20 further comprising:
a phase lock loop receiving the receiver tuning signal from the controller and coupled to the voltage controlled oscillator for controlling the frequency of oscillation of the voltage controlled oscillator in accordance with a frequency specified by the receiver tuning signal.

22. A RF paging receiver which is tunable to channels to receive pages with the pages being transmitted in a plurality of licensed frequency bands with each band containing a plurality of FM channels in which signal strength of pages on received channels in the bands varies as a result of variable antenna gain with programming of channels being accomplished by channel programming commands comprising:
(a) a tunable antenna having a reception bandwidth spanning the frequency bands with the antenna being tunable in response to an antenna tuning signal to achieve maximum antenna gain for a received channel in any one of the plurality of licensed frequency bands;
(b) a RF tuner, coupled to the tunable antenna, for receiving individual channels from the bands in response to varying a receiver tuning signal specifying reception of one of the channels within the plurality of frequency bands, the RF tuner comprising a plurality of RF amplifiers with each RF amplifier for amplifying channels from at least one different licensed frequency band, each RF amplifier having an operating bandwidth which is narrower in frequency than the frequency band of channels applied to the RF amplifier and which is shiftable to center the operating bandwidth within the frequency band of channels applied to the RF amplifier on the specified channel in response to an RF amplifier tuning signal;
(c) an IF signal processing means, coupled to the RF tuner, for producing an intermediate frequency signal, for producing the antenna tuning signal which is proportional to the level of the intermediate signal during operation of the RF tuner to tune the antenna to achieve maximum antenna gain in response to receiving a specified channel from any one of the channels within the frequency bands, and for producing the RF amplifier tuning signal by a summation of a signal which is a function of a level of the intermediate frequency signal and a signal which is a function of a level of the receiver tuning signal; and
(d) a controller, coupled to the intermediate frequency signal, and responsive to channel programming commands, for decoding a change in at least one channel contained within a channel programming command and controlling generation of the receiver tuning signal applied to the RF tuner specifying reception of one channel specified by a received channel programing command from one of the frequency bands to cause reception of the specified channel.

23. A paging receiver in accordance with claim 22 wherein:
the amplifier tuning signal is proportional to a sum of the intermediate frequency signal and the receiver tuning signal with the receiver tuning signal varying from a minimum for a channel having a lowest frequency within the at least one frequency band to a maximum for a channel having a highest frequency within the at least one frequency band.

24. A RF paging receiver in accordance with claim 22 wherein:
(a) the paging receiver is battery powered; and
(b) the controller controls the activation of the plurality of RF amplifiers to cause only the RF amplifier which amplifies channels of the frequency within which the specified channel is contained to be activated.

25. A RF paging receiver in accordance with claim 24 wherein:
the antenna is contained inside of the paging receiver.

26. A RF paging receiver in accordance with claim 25 wherein:
the frequency bands include UHF and VHF signal bands.

27. A RF paging receiver in accordance with claim 26 wherein:
VHF band includes a 280 MHz band with adjacent channels separated by a 2.5 KHz step, some adjacent channels in the VHF and UHF bands being separated by 5 KHz steps and some adjacent channels in the VHF band being separated by 6.25 KHZ steps.

28. A RF paging receiver which is tunable to channels to receive pages with the pages being transmitted in at least one licensed frequency band with each band containing a plurality of FM channels in which signal strength of the pages on received channels in the at least one band varies as a result of variable antenna gain comprising:
(a) a tunable antenna having a reception bandwidth spanning the at least one frequency band with the antenna being tunable in response to an antenna tuning signal to achieve maximum antenna gain for a received channel in the at least one licensed frequency band;
(b) a RF tuner, coupled to the tunable antenna, which is tunable for receiving each of the individual channels from the at least one frequency and in response to varying a receiver tuning signal specifying reception of one of the channels within the at least one frequency band, the RF tuner comprising at least one RF amplifier with each RF amplifier for amplifying a page received on any channel within at least one frequency band, each RF amplifier having an operating bandwidth which is narrower in frequency than the at least one frequency band of channels applied to the RF amplifier and which is shiftable to center the operating bandwidth within the at least one licensed frequency band of channels applied to the RF amplifier on the specified channel in response to an RF amplifier tuning signal;
(c) an IF amplifier, coupled to the RF tuner, for producing an intermediate frequency signal containing pages transmitted on the specified channel;
(d) means responsive to the intermediate frequency signal, for producing the antenna tuning signal as a function of the intermediate frequency signal; and
(e) means, responsive to the intermediate frequency signal and the receiver tuning signal, for producing the RF amplifier tuning signal by a summation of a signal which is a function of a magnitude of the intermediate frequency signal and a signal which is a function of a magnitude of the receiver tuning signal.

29. A RF paging receiver in accordance with claim 28 wherein:

the amplifier tuning signal is proportional to a sum of the intermediate frequency signal and the receiver tuning signal with the receiver tuning signal varying from a minimum for a channel having a lowest frequency within the at least one frequency band to a maximum for a channel having a highest frequency within the at least one frequency band.

30. A RF paging receiver in accordance with claim 28 wherein:

(a) the RF tuner has a plurality of RF amplifiers, each RF amplifier amplifying pages received on channels from at least one frequency band and having an operating bandwidth which is narrower in frequency than the frequency band and being tunable to center the operating bandwidth within the at least one frequency band of the RF amplifier in response to the RF amplifier tuning signal of the specified channel.

31. A RF receiver which is tunable to channels for receiving transmissions in at least one frequency band with each frequency band containing a plurality of channels in which signal strength of the transmissions on a received channel in the at least one band varies as a result of variable antenna gain comprising:

a tunable antenna having a reception bandwidth spanning the at least one frequency band with the antenna being tunable in response to an antenna tuning signal to achieve maximum antenna gain for the received channel in the at least one frequency band;

a tunable RF amplifier, coupled to the tunable antenna, for amplifying transmissions received on the received channel within the at least one frequency band and having an operating bandwidth which is narrower in frequency than the at least one frequency band and which is shiftable to center the operating bandwidth within the at least one frequency band on the received channel; and a mixer, coupled to the RF amplifier, for shifting a transmission amplified by the RF amplifier on the received channel to a lower frequency; and wherein the antenna tuning signal is generated by an antenna tuning circuit and is a function of a signal level produced by an intermediate frequency circuit in receiving a transmission on the received channel; and the tunable RF amplifier is tuned by an RF amplifier tuning signal, produced by a summation of a signal which is a function of a magnitude of a receiver tuning signal specifying the channel on which a transmission is received and a signal which is a function of a magnitude of the intermediate frequency signal.

32. A RF receiver in accordance with claim 31 wherein: the RF receiver is a paging receiver.

33. A method of tuning a receiver which is tunable to channels to receive information with the information being transmitted in at least one licensed frequency band with each frequency band containing a plurality of FM channels in which signal strength of the information on received channels in the at least one frequency band varies in receiving a specified channel comprising:

receiving a transmission on the specified channel;

detecting a magnitude of a signal produced from an output of the RF amplifier;

tuning the antenna to produce a maximum antenna gain in response to the magnitude of the signal produced from the output of the RF amplifier; and shifting a center of a bandwidth of the RF amplifier within the at least one frequency band to produce maximum RF amplifier gain for the specified channel in response to an RF amplifier tuning signal produced by a summation of a signal which is a function of a magnitude of the signal produced from the output of the RF amplifier and a signal which is a function of a magnitude of a receiver tuning signal which specifies the channel being received.

* * * * *